US009589809B2

(12) United States Patent
Xu et al.

(10) Patent No.: US 9,589,809 B2
(45) Date of Patent: Mar. 7, 2017

(54) METHOD OF DEPOSITING TUNGSTEN LAYER WITH IMPROVED ADHESION AND FILLING BEHAVIOR

(71) Applicant: INSTITUTE OF MICROELECTRONICS, CHINESE ACADEMY OF SCIENCES, Beijing (CN)

(72) Inventors: Qiang Xu, Beijing (CN); Chao Zhao, Kessel-lo (BE); Jun Luo, Beijing (CN); Guilei Wang, Beijing (CN); Tao Yang, Beijing (CN); Junfeng Li, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/744,835

(22) Filed: Jun. 19, 2015

(65) Prior Publication Data

US 2015/0287606 A1    Oct. 8, 2015

Related U.S. Application Data

(63) Continuation of application No. PCT/CN2014/072304, filed on Feb. 20, 2014.

(30) Foreign Application Priority Data

Jan. 3, 2014    (CN) .......................... 2014 1 0003202

(51) Int. Cl.
*H01L 21/28* (2006.01)
*H01L 21/285* (2006.01)
(Continued)

(52) U.S. Cl.
CPC .... *H01L 21/28562* (2013.01); *C23C 16/0272* (2013.01); *C23C 16/14* (2013.01);
(Continued)

(58) Field of Classification Search
CPC ......... H01L 21/28562; H01L 21/28079; H01L 21/32051; H01L 21/76876; H01L 21/76877; C23C 16/45525
See application file for complete search history.

(56) References Cited

U.S. PATENT DOCUMENTS

2008/0081452 A1    4/2008  Kim et al.
2009/0142925 A1*   6/2009  Ha ................... H01L 21/28061
                                                                  438/680

FOREIGN PATENT DOCUMENTS

CN          1436876 A      8/2003
CN        101154576 A      4/2008
(Continued)

OTHER PUBLICATIONS

International Search Report and Written Opinion in International Application No. PCT/CN2014/072304, mailed on Sep. 28, 2014.

*Primary Examiner* — Armando Rodriguez
(74) *Attorney, Agent, or Firm* — Knobbe, Martens, Olson & Bear, LLP

(57) ABSTRACT

A method of depositing a tungsten (W) layer is disclosed. In one aspect, the method includes depositing a $SiH_4$ base W film on a surface of a substrate to preprocess the surface. The method includes depositing a $B_2H_6$ base W layer on the preprocessed surface. The $SiH_4$ base W film may be several atom layers thick. The film and base W layer may be deposited in a single ALD process, include reactive gas soak, reactive gas introduction, and main deposition operations. Forming the film may include introducing $SiH_4$ gas into a reactive cavity during the gas soak operation, and introducing $SiH_4$ and $WF_6$ gas into the cavity during the gas introduction operation. The $SiH_4$ and $WF_6$ gases may be alternately introduced, for a number of cycles depending on the thickness of the tungsten layer to be deposited.

9 Claims, 4 Drawing Sheets

(51) Int. Cl.
    *C23C 16/02*         (2006.01)
    *C23C 16/14*         (2006.01)
    *C23C 16/455*       (2006.01)
    *H01L 21/3205*      (2006.01)
    *H01L 21/768*       (2006.01)

(52) U.S. Cl.
    CPC .. *C23C 16/45525* (2013.01); *H01L 21/28079* (2013.01); *H01L 21/28088* (2013.01); *H01L 21/32051* (2013.01); *H01L 21/76876* (2013.01); *H01L 21/76877* (2013.01)

(56) References Cited

FOREIGN PATENT DOCUMENTS

| | | |
|---|---|---|
| CN | 101447427 A | 6/2009 |
| CN | 101593723 A | 12/2009 |

\* cited by examiner

METHOD OF DEPOSITING TUNGSTEN LAYER WITH IMPROVED ADHESION AND FILLING BEHAVIOR

RELATED APPLICATIONS

This application claims priority to International Application No PCT/CN2014/072304, filed on Feb. 20, 2014, entitled "METHOD OF DEPOSITING TUNGSTEN LAYER WITH IMPROVED ADHESION AND FILLING BEHAVIOR," and Chinese Application No. 201410003202.1, filed on Jan. 3, 2014, each of which is incorporated herein by reference in its entirety.

BACKGROUND

Field

The disclosed technology relates to semiconductor manufacturing, and particularly to a method of depositing a tungsten (W) layer on a substrate with improved adhesion and filling behavior.

Description of the Related Technology

As the feature size of complementary metal oxide semiconductor (CMOS) devices scales down, gate oxide thickness approaches atomic distances. Due to the tunneling effect, increased gate leakage current, reduced reliability and the like become significant problems. Thus, the conventional gate dielectric material of $SiO_2$ cannot meet the requirement for further scaling of CMOS devices. Beyond 45 nm node process technology, it may be necessary to replace $SiO_2$ with gate dielectrics with a high dielectric constant (high-K). However, conventional polysilicon gates may not be compatible with high-K material, leading to problems including increased threshold voltage ($V_t$), and significant interfacial reaction during annealing. Replacing polysilicon gates with metal gates may reduce gate depletion and boron penetration which are inherent to polysilicon gates.

High-K gates may be fabricated with either gate-first processes or gate-last processes. Gate-first processes are similar to conventional $SiO_2$/polysilicon gate processes. In gate-first processes, gate dielectrics and metal gates are formed prior to forming drain and source regions. In contrast, in gate-last processes, sacrificial gates, sacrificial gate dielectric layers, source and drain regions, and interlayer dielectric layers are formed first. Then, sacrificial gates are removed and gates are re-formed.

Gate-first processes may anneal the source and drain at high temperatures that adversely impact some gate materials. As a result, the choice of gate materials is constrained for CMOS devices fabricated using these processes. An advantage of gate-last processes is that the gate material need not undergo annealing at high temperature. As a result, a greater variety of materials can be used to fabricate CMOS gates with gate-last processes. Companies can employ gate-last processes to develop and manufacture CMOS devices with small feature sizes, such as 45 nm or less.

Aluminum (Al) or tungsten (W) may be utilized for the gate electrode in gate-last processes. Intel reported a chip process of 45 nm utilizing Al as the material for the gate electrode. Since a planarization process follows the process of filling the metal electrode, and it is difficult to control the planarization process for aluminum in large-scale production, tungsten (W) may be a candidate gate material.

For gate-last processes, filling the gate material is implemented after removing the sacrificial gate, and thus the requirement for the filling behavior of the gate material is strict. Further, beyond 22 nm node process technology, the space for gate filling becomes smaller. As a result, conventional chemical vapor deposition (CVD) method may not meet the requirements for filling tungsten. Instead, atomic layer deposition (ALD) manufactured by a $B_2H_6$ source may be used to meet sheet resistance and filling behavior requirements for tungsten for metal gates.

However, since the B2H6 base ALD W film has poor adhesion, it may crack in the subsequent metal planarization process and to delaminate from a barrier layer of TiN, which adversely impacts yield.

SUMMARY OF CERTAIN INVENTIVE ASPECTS

The disclosed technology includes a method of depositing a tungsten (W) layer on a substrate with improved adhesion and filling behavior.

One aspect of the disclosed technology is a method of depositing a tungsten (W) layer. The method includes preprocessing a substrate by depositing a $SiH_4$ base W film on a surface of a substrate to preprocess the substrate. The method includes depositing a $B_2H_6$ base W layer on the preprocessed surface.

In an embodiment, the $SiH_4$ base W film is several atom layers thick.

In an embodiment, the method includes depositing the $SiH_4$ base W film and the $B_2H_6$ base W layer in a single atomic layer deposition (ALD) process. In an embodiment, the single atomic layer deposition (ALD) process may include a reactive source gas soak operation. In an embodiment, the single atomic layer deposition (ALD) process may include a reactive source gas introduction operation. In an embodiment, the single atomic layer deposition (ALD) process may include a main deposition operation.

In an embodiment, forming the $SiH_4$ base W film may include introducing $SiH_4$ gas to a reactive cavity during the reactive source gas soak operation. In an embodiment, forming the $SiH_4$ base W film may include introducing a $SiH_4$ gas and a $WF_6$ gas to the reactive cavity during the reactive source gas introduction operation. In an embodiment, the reactive source gas introduction operation may include alternately introducing $SiH_4$ gas and $WF_6$ gas into the reactive cavity for several cycles. In an embodiment, the number of cycles is 2-10.

In an embodiment, depositing the $B_2H_6$ base W layer may include alternately introducing $B_2H_6$ gas and $WF_6$ gas into the reactive cavity for a number of cycles during the main deposition operation. The number of the cycles may depend on a thickness of the tungsten layer to be deposited.

In an embodiment, the substrate may comprise a gate trench formed by a gate-last process, and the W film and the W layer may fill into the gate trench to function as a gate electrode.

According to embodiments of the disclosed technology, prior to depositing the $B_2H_6$ base W layer, the substrate is preprocessed by the $SiH_4$ gas so as to form the $SiH_4$ base W film several atom layers thick for improved filling behavior of the $B_2H_6$ base W layer and improved adhesion by incorporating the $SiH_4$ base W film. The deposition of the $B_2H_6$ base W layer and that of the $SiH_4$ base W film may be implemented in a single ALD process. Thus, the yield can be increased and the window for filling may be extended.

BRIEF DESCRIPTION OF THE DRAWINGS

The above and other objects, features and advantages of the disclosed technology become more apparent from the following descriptions of embodiments with reference to the accompanying drawings.

DETAILED DESCRIPTION OF CERTAIN INVENTIVE ASPECTS

Hereinafter, descriptions are given with reference to embodiments shown in the attached drawings. However, it is to be understood that these descriptions are illustrative and not intended to limit the disclosed technology. Further, in the following, known structures and technologies are not described to avoid obscuring the disclosed technology unnecessarily.

Figure 1:
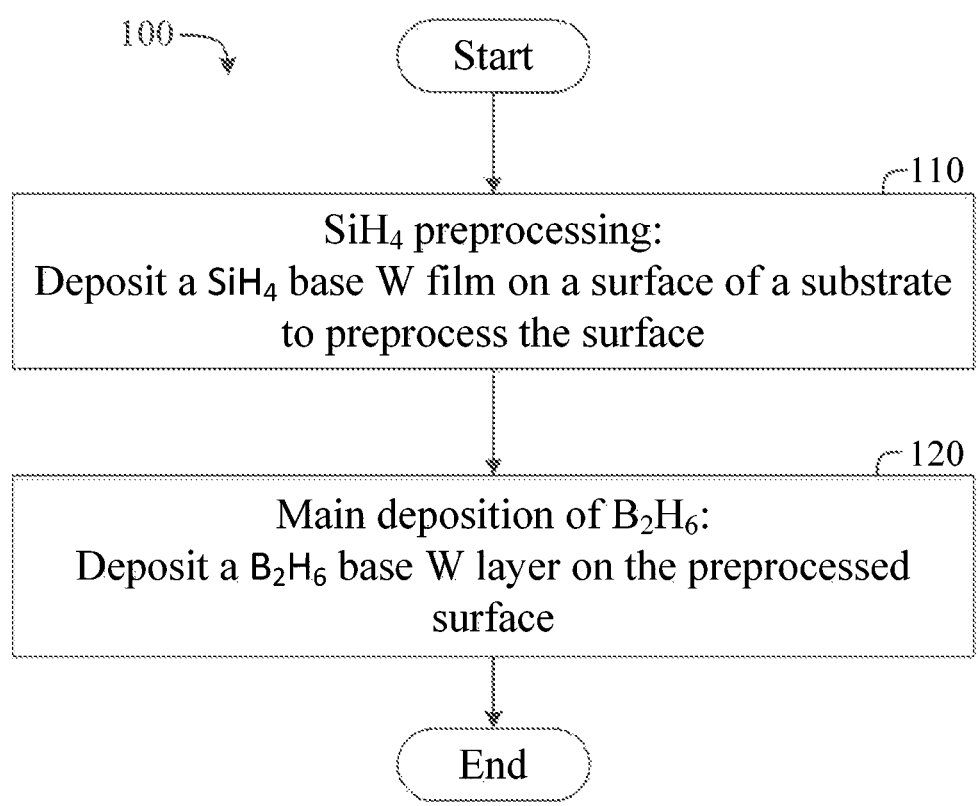
FIG. 1 is a flowchart illustrating a method of depositing a W layer in an embodiment of the disclosed technology.

FIG. 1 shows a flowchart of a method of depositing a W layer (tungsten layer) according to an embodiment of the disclosed technology. In block 110, method 100 preprocesses a surface where a tungsten (W) layer is to be deposited by depositing a $SiH_4$ base W film on a surface of a substrate.

For example, such a surface may comprise a surface of a substrate on which a device may be formed. The substrate may comprise various suitable substrates, such as a bulk semiconductor substrate, a semiconductor on insulator (SOI) substrate, and so on. In the following, the bulk silicon substrate is taken as an example, but the disclosed technology is not limited thereto.

In an embodiment, a device, or a part of a device, manufactured by a gate-last process is formed on the substrate. For example, such a device may be manufactured as follows. A sacrificial gate stack including a sacrificial gate dielectric layer (for example, $SiO_2$) and a sacrificial gate conductor (for example, polysilicon) may be formed on the substrate. Halo implantation and extension implantation may be performed with the sacrificial gate stack as a mask. Then, a gate spacer of, for example, nitride, may be formed on sidewalls of the sacrificial gate stack, and source/drain (S/D) implantation may be performed with the gate spacer and the sacrificial gate stack as a mask. A thermal treatment may be performed to activate implanted ions. Then, an interlayer dielectric layer of, for example, oxide, may be deposited on the substrate, and a planarization process such as chemical mechanical polishing (CMP) may be performed on the interlayer dielectric layer. The planarization process may stop on the gate spacer so as to expose the sacrificial gate stack. The sacrificial gate stack may be selectively removed so as to leave a gate trench at an inner side of the gate spacer. Next, an actual gate stack may be filled into the gate trench, for example, including a high-K gate dielectric layer of, for example, $HfO_2$, and a metal gate conductor of, for example, W. The method 100 may be applied for filling a W layer into the gate trench.

The gate-last process is not limited to the above implementation as those skilled in the art may conceive various ways to implement the gate-last process. Furthermore, although it is illustrated by filling a W layer into the gate trench as a an example, the technique of the disclosed technology may be applied to any other application which needs to deposit a W layer, such as filling a W layer into a limited space such as a trench or hole.

In an embodiment, the preprocessing includes introducing a $SiH_4$ gas into a reactive cavity where the surface to be processed; for example, where the substrate carrying this surface is located. As will be further illustrated in detail, the preprocessing may be incorporated into an atomic layer deposition (ALD) process. In this case, the reactive cavity may be a place where the ALD is to be performed. Such preprocessing may lead to a W film of several (for example, less than 10) atom layers on the surface. The $SiH_4$ base W film helps to improve the adherence of the body of a W layer to be deposited subsequently (to, for example, an underlying TiN barrier layer).

In block 120, method 100 deposits a $B_2H_6$ base W layer on the preprocessed surface. After the preprocessing operation 110, the method 100 may comprise an operation 120 of further depositing a $B_2H_6$ base W layer on the surface (in particular, on the $SiH_4$ base W film). For example, the $B_2H_6$ base W layer may be deposited by alternately introducing a $B_2H_6$ gas and a $WF_6$ gas to the reactive cavity, and such a deposition may be by ALD. Since the growth rate for the $B_2H_6$ base W layer is relatively slow (for example, about 3.1 Å/cycle), the filling behavior is good.

Figure 2:
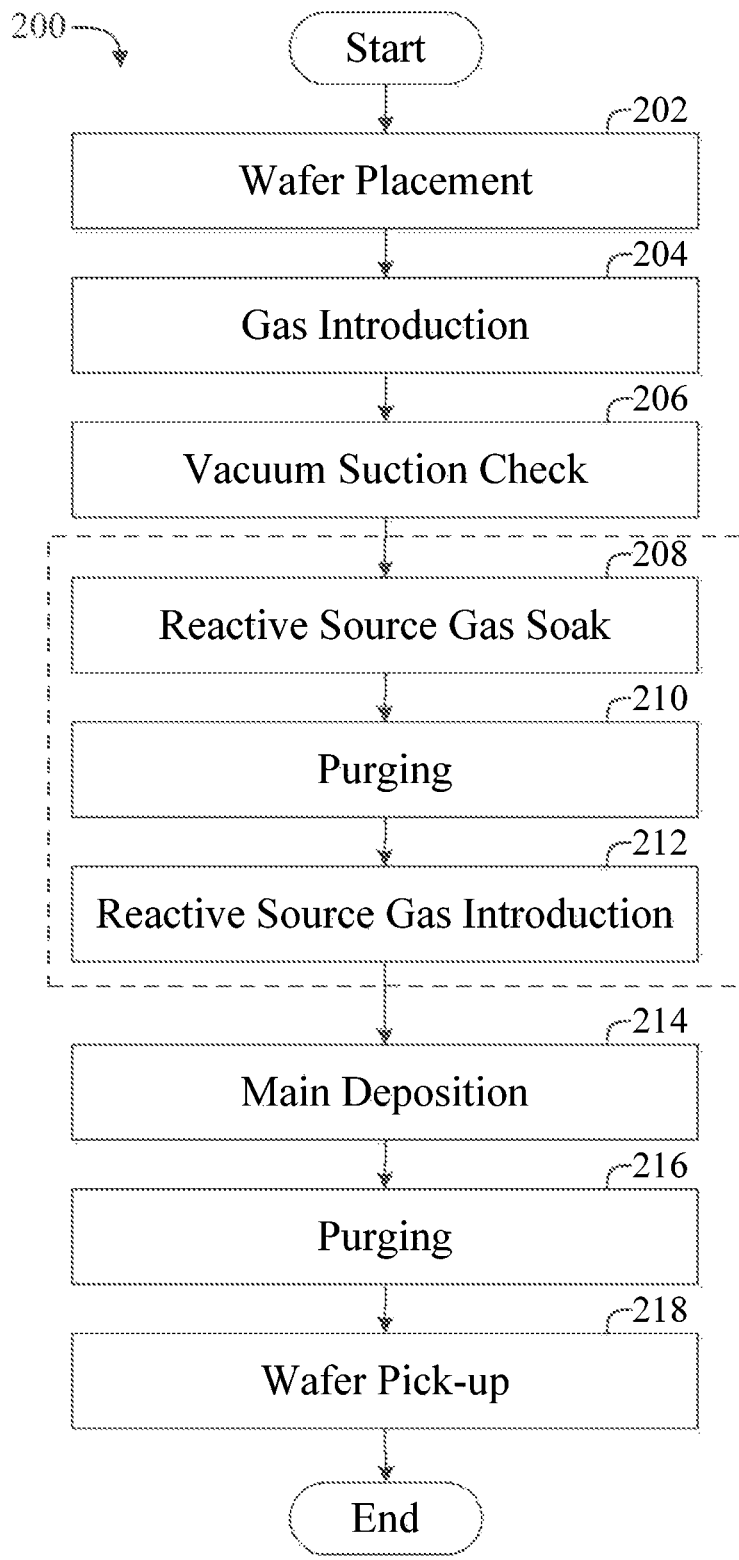
FIG. 2 is a flowchart of an atomic layer deposition (ALD) process in an embodiment of the disclosed technology.

As mentioned above, the technique of the disclosed technology may be incorporated to the ALD process. FIG. 2 is a flowchart of an atomic layer deposition (ALD) process 200. In block 202, process 200 positions a wafer to be processed into a reactive cavity. In block 204, process 200 introduces an inert gas such as Ar to the reactive cavity to keep a certain degree of vacuum within the reactive cavity. In block 206, method 200 conducts a check to ensure that the process smoothly goes on to check whether the wafer is reliably fixed (for example, by vacuum suction) to a reactive base.

After the preparing operations of wafer placement 202, gas introduction 204, and vacuum suction check 206, formal deposition may be started. In block 208, method 200 conducts a reactive source gas soak operation 208, in which a reactive source gas is introduced to the reactive cavity. In block 210, method 200 conducts a purging operation, in which an inert gas removes the extra reactive source gas adsorbed on the surface of the wafer. In block 212, method 200 conducts a reactive source gas introduction, in which reactive source gases are introduced into the reactive cavity.

In block 214, method 200 performs a main deposition operation, in which reactive gases may be alternately introduced into the reactive cavity (for example, in case of depositing a $B_2H_6$ base W layer, a $B_2H_6$ gas and a $WF_6$ gas may be alternately introduced). The reactive gases react within the reactive cavity to generate a thin film with a desired composition. During the procedure of introducing the reactive gases, an inert gas may be used for purging to remove the extra reactive gases. After depositing a thin film with a certain thickness, in block 216, method 200 conducts a purging operation in which an inert gas takes away the extra reactive gases in the reactive cavity. In block 218, method 200 conducts a wafer pick-up operation, in which the wafer with the deposited thin film is removed from the reactive cavity.

According to a conventional technique, in case of utilizing the reactive gases of $B_2H_6$ and $WF_6$ to deposit the $B_2H_6$ base W layer, the $B_2H_6$ gas is usually introduced in the reactive source gas soak operation 208 and the $B_2H_6$ gas and the $WF_6$ gas are introduced in the reactive source gas introduction operation 212. In contrast, according to an embodiment of the disclosed technology, the $SiH_4$ gas may be introduced in the operation 208 and the $SiH_4$ gas and the $WF_6$ gas may be introduced in the reactive source gas introduction of block 212. Such operations of reactive source gas soak in block 208 and reactive source gas introduction in block 210 may lead to preprocessing on the surface and forming a $SiH_4$ base W film.

In the reactive source gas introduction operation in block 212, the $SiH_4$ gas and the $WF_6$ gas may be alternately introduced. For example, when the $SiH_4$ gas is being introduced, the $SiH_4$ gas may be adsorbed to the surface of the wafer. Then, when the $WF_6$ is being introduced, $WF_6$ may react with $SiH_4$ adsorbed to the surface of the wafer so as to form a W film on the surface of the wafer. Every time the $SiH_4$ and $WF_6$ gases are introduced, an inert gas may be used for purging to remove the extra reactive gases so that only a single layer or several layers of atoms are absorbed to the surface of the wafer. Thus, the reaction occurred on the surface of the wafer may be controlled in unit of an atom layer. The above mentioned operations may constitute a cycle. The $SiH_4$ gas and the $WF_6$ gas may be alternately introduced for several (for example, 2-10) cycles to form a $SiH_4$ base W film with a thickness of several atom layers.

Likewise, in the main deposition operation in block 214, the $B_2H_6$ gas and the $WF_6$ gas may be alternately introduced. Every time the $B_2H_6$ and $WF_6$ gases are introduced, an inert gas may be used for purging. A number of cycles (for example, 250 cycles) may be performed to deposit a $B_2H_6$ base W layer with a desired thickness. The number of the cycles of the main deposition operation mainly depends on the thickness of the W layer to be deposited.

In the above description, particular process parameters for the respective steps in the ALD process are not illustrated. Those skilled in the may set these process parameters as necessary according to particular designs and particular deposition tools. Furthermore, those skilled in the art may conceive various flows for the ALD process. For example, some steps may be omitted from or added to the flowchart 200 shown in FIG. 2.

Figure 3A:
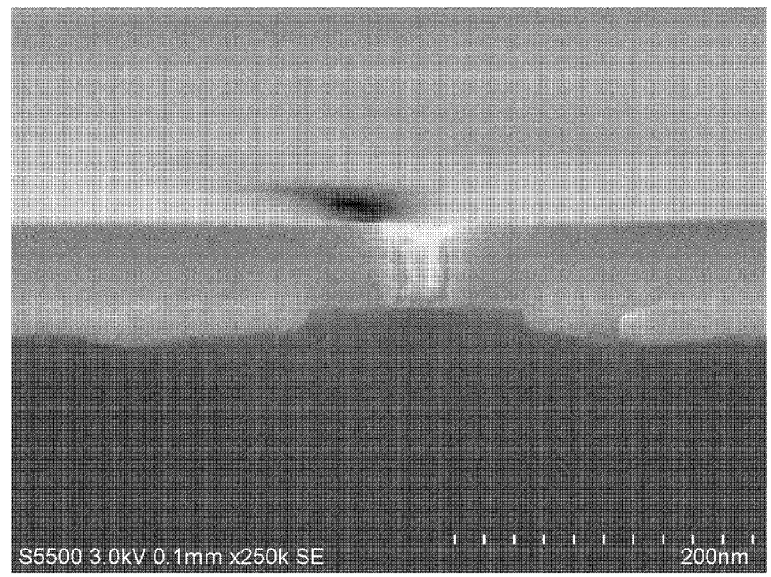
FIG. 3A is a cross sectional view of a W layer manufactured according to an embodiment of the disclosed technology.
Figure 3B:
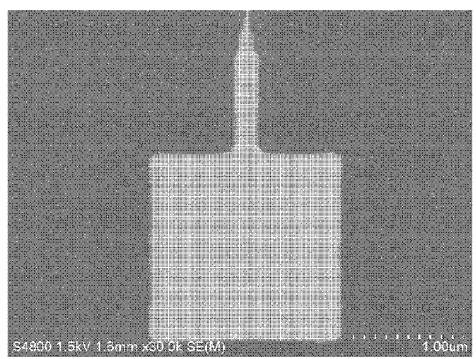
FIG. 3B is a top view, corresponding to the cross sectional view in FIG. 3A, of a W layer manufactured according to an embodiment of the disclosed technology.
Figure 4A:
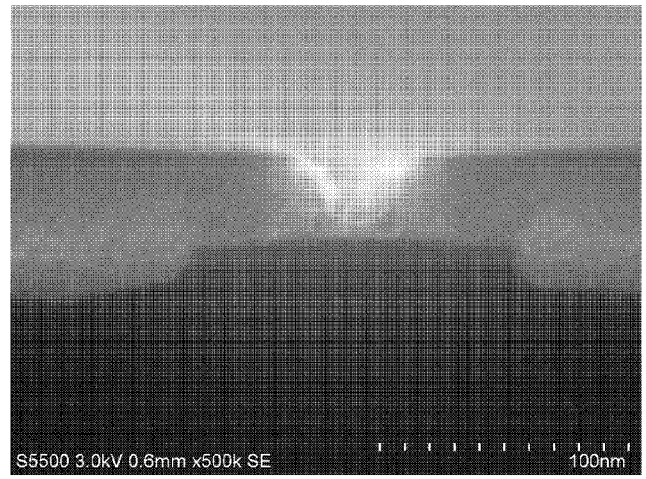
FIG. 4A is a cross sectional view of a $B_2H_6$ base W layer manufactured according to a conventional method.
Figure 4B:
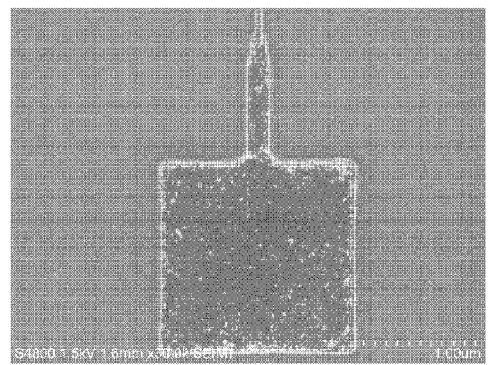
FIG. 4B is a top view, corresponding to the cross sectional view in FIG. 4A, of a $B_2H_6$ base W layer manufactured according to a conventional method.

FIG. 3A is a cross sectional view of a W layer manufactured according to an embodiment of the disclosed technology. FIG. 3B is a top view, corresponding to the cross sectional view in FIG. 3A, of a W layer manufactured according to an embodiment of the disclosed technology. FIG. 4A is a cross sectional view of a $B_2H_6$ base W layer manufactured according to a conventional method. FIG. 4B is a top view, corresponding to the cross sectional view in FIG. 4A, of a $B_2H_6$ base W layer manufactured according to a conventional method. It can be seen by comparing FIG. 3A and FIG. 4A that the W layer according to the embodiment of the disclosed technology keeps good filling into the gate trench, and it can be seen by comparing FIG. 3B and FIG. 4B that the W layer according to the embodiment of the disclosed technology has better adhesion (fewer cracks).

According to embodiments of the disclosed technology, the resultant W layer has better adhesion and a good filling behavior, and applying it to a 22 nm metal gate electrode may improve the yield and may extend the process window for filling.

The embodiments of the disclosed technology are illustrated as mentioned above. However, these embodiments are provided for illustration and are not intended to limit the scope of the invention aspects which are defined by the accompanying claims and their equivalents. Without departing from the scope of the disclosed technology, those skilled in the art may make any alternation or modification which falls in the scope of the present invention.

What is claimed is:

1. A method of depositing a tungsten (W) layer, comprising:
    depositing a $SiH_4$ base W film on a surface of a substrate to preprocess the surface; and
    depositing a $B_2H_6$ base W layer on the preprocessed surface, wherein the substrate comprises a gate trench formed by a gate-last process, and wherein the W film and the W layer fill into the gate trench to function as a gate electrode.

2. The method of claim 1, wherein the $SiH_4$ base W film is several atom layers thick.

3. The method of claim 1, further comprising depositing the $SiH_4$ base W film and the $B_2H_6$ base W layer in a single atomic layer deposition (ALD) process.

4. The method of claim 3, wherein the single atomic layer deposition (ALD) process comprises:
    a reactive source gas soak operation;
    a reactive source gas introduction operation; and
    a main deposition operation.

5. The method of claim 4, wherein forming the $SiH_4$ base W film comprises:
    introducing $SiH_4$ gas to a reactive cavity during the reactive source gas soak operation; and
    introducing $SiH_4$ gas and $WF_6$ gas to the reactive cavity during the reactive source gas introduction operation.

6. The method of claim 5, wherein the reactive source gas introduction operation comprises alternately introducing $SiH_4$ gas and $WF_6$ gas into the reactive cavity for several cycles.

7. The method of claim 6, wherein the number of cycles is 2-10.

8. The method of claim 4, wherein depositing the $B_2H_6$ base W layer comprises:
    alternately introducing $B_2H_6$ gas and $WF_6$ gas into a reactive cavity for a number of cycles during the main deposition operation.

9. The method of claim 8, wherein the number of the cycles depends on a thickness of the W layer to be deposited.

* * * * *